United States Patent [19]
Dixon

[11] Patent Number: 5,554,907
[45] Date of Patent: Sep. 10, 1996

[54] VEHICLE SPEED MEASUREMENT APPARATUS

[75] Inventor: Donald A. Dixon, Columbia, Md.

[73] Assignee: Mitron Systems Corporation, Columbia, Md.

[21] Appl. No.: 904,623

[22] Filed: Jun. 26, 1992

Related U.S. Application Data

[63] Continuation-in-part of Ser. No. 880,638, May 8, 1992, abandoned.

[51] Int. Cl.$^6$ .............................. H01L 41/08; G08G 1/02
[52] U.S. Cl. .................... 310/339; 310/319; 310/800; 340/936; 340/933
[58] Field of Search .................... 310/330–332, 310/328, 338, 339, 800, 319; 340/933, 936

[56] References Cited

U.S. PATENT DOCUMENTS

| | | | |
|---|---|---|---|
| 2,067,336 | 1/1937 | Paver | 340/933 |
| 2,403,277 | 7/1946 | Hall | 340/933 |
| 3,750,127 | 7/1973 | Ayers et al. | 310/800 X |
| 3,798,474 | 3/1974 | Cassand et al. | 310/800 X |
| 3,903,733 | 9/1975 | Murayama et al. | 310/800 X |
| 3,911,390 | 10/1975 | Myers | 340/933 |
| 4,216,403 | 8/1980 | Krempl et al. | 310/800 X |
| 4,304,126 | 12/1981 | Yelke | 310/800 X |
| 4,322,877 | 4/1982 | Taylor | 310/800 X |
| 4,369,391 | 1/1983 | Micheron | 310/800 X |
| 4,383,239 | 5/1983 | Robert | 340/933 |
| 4,443,730 | 4/1984 | Kitamura et al. | 310/800 X |
| 4,585,970 | 4/1986 | Koal et al. | 310/331 |
| 4,603,241 | 7/1986 | Nardi | 200/86 R |
| 4,629,925 | 12/1986 | Booth et al. | 310/800 X |
| 4,688,306 | 8/1987 | Soni et al. | 310/800 X |
| 4,695,988 | 9/1987 | Banno | 310/800 X |
| 4,716,413 | 12/1987 | Haile | 340/933 |
| 4,794,295 | 12/1988 | Penneck et al. | 310/800 X |
| 4,810,913 | 3/1989 | Beuducel et al. | 310/800 X |
| 4,824,107 | 4/1989 | French | 310/800 X |
| 4,839,480 | 6/1989 | Bickley | 200/86 A |
| 5,008,666 | 4/1991 | Gebert et al. | 340/933 X |

FOREIGN PATENT DOCUMENTS

| | | | |
|---|---|---|---|
| 0287250 | 10/1988 | European Pat. Off. | 340/933 |
| 2042256 | 9/1980 | United Kingdom | 310/800 |

OTHER PUBLICATIONS

"A Review of Current Traffic Sensor Technology", Robert M. Tyburski.

*Primary Examiner*—Mark O. Budd
*Attorney, Agent, or Firm*—Jim Zegeer, Esq.

[57] ABSTRACT

A vehicle speed monitoring system has a pair of parallel piezoelectric sensors or pressure transducers carried in closely spaced relation by a common elastomeric carrier such that the distance D between the sensors is maintained constant. A time measuring circuit connected to the sensors measures the time between peak voltages induced in the piezoelectric sensor transducers which is used to calculate and display vehicle speed. A weight is secured to or embedded in the carrier to cause the carrier to hug the roadway and be immune to lifting because of air currents and turbulence.

2 Claims, 3 Drawing Sheets

_5,554,907_

VEHICLE SPEED MEASUREMENT APPARATUS

REFERENCE TO RELATED APPLICATIONS

This application is a continuation-in-part of patent application Ser. No. 07/880,638 filed May 8, 1992 entitled "VEHICLE SPEED MEASUREMENT APPARATUS" now abandoned, and this application is related to U.S. application Ser. No. 07/880,410 of Robert M. Tyburski entitled "ROADWAY SENSOR SYSTEMS" filed May 8, 1992 now U.S. Pat. No. 5,463,385 issued Nov. 31, 1995 and U.S. application Ser. No. 07/346,685 entitled "ROADWAY SENSORS AND METHOD", filed May 3, 1989 now abandoned, and U.S. application Ser. No. 07/406,345 entitled "ROADWAY SENSORS AND METHOD OF INSTALLING SAME", filed Sep. 13, 1989 now abandoned, all owned by the assignee hereof.

BACKGROUND AND BRIEF DESCRIPTION OF THE INVENTION

The present invention relates to vehicle speed measurement apparatus. Radar-type vehicle speed measurement have been used for many years. However, they are easily detected by vehicle carried radar detectors and have numerous problems regarding accuracy, reliability and operator safety. Pairs of spaced roadway tubes have been used to measure speed of vehicles, but these require substantial spacing between tubes, and any stretching of the tubes induces inaccuracies in speed measurements. Moreover, if the first tube is spotted by a speeding driver, a quick braking action between the spaced tubes can enable the driver to possibly avoid detection.

According to the present invention, a pair of closely spaced (within a few inches or less) piezoelectric sensors of the same length are encased in a common rubber extrusion so that they are parallel to one another and at a predetermined distance apart, which is maintained by the rubber extrusion. The device is placed in a lane and is large enough to sense the speed of each vehicle traveling in that lane. It has a low profile to the road surface and can be camouflaged to deter visual detection. A linear weight, such as a flat strip of heavy metal such as lead, is encased under the rubber extrusion to keep it immobile while vehicles are traveling over it. The spaced piezoelectric sensors are coupled to a time measuring circuit to measure the peak times of voltage pulses induced in the closely spaced piezoelectric sensors. The measuring circuit, which may include a microprocessor, calculates the vehicle's speed and displays it on a portable monitor. The system is self-testing to insure accuracy prior to operation. The system can be powered by batteries or from a remote cigarette lighter adaptor. The system allows the operator to monitor the speed of each vehicle that travels over the speed sensor or freeze the speed of the last vehicle. The system could be modified to perform volume and speed recordings.

DESCRIPTION OF THE DRAWINGS

The above and other objects, advantages and features of the invention will become more apparent when considered with the following specification and accompanying drawings wherein.

DETAILED DESCRIPTION OF THE INVENTION

Figure 1:
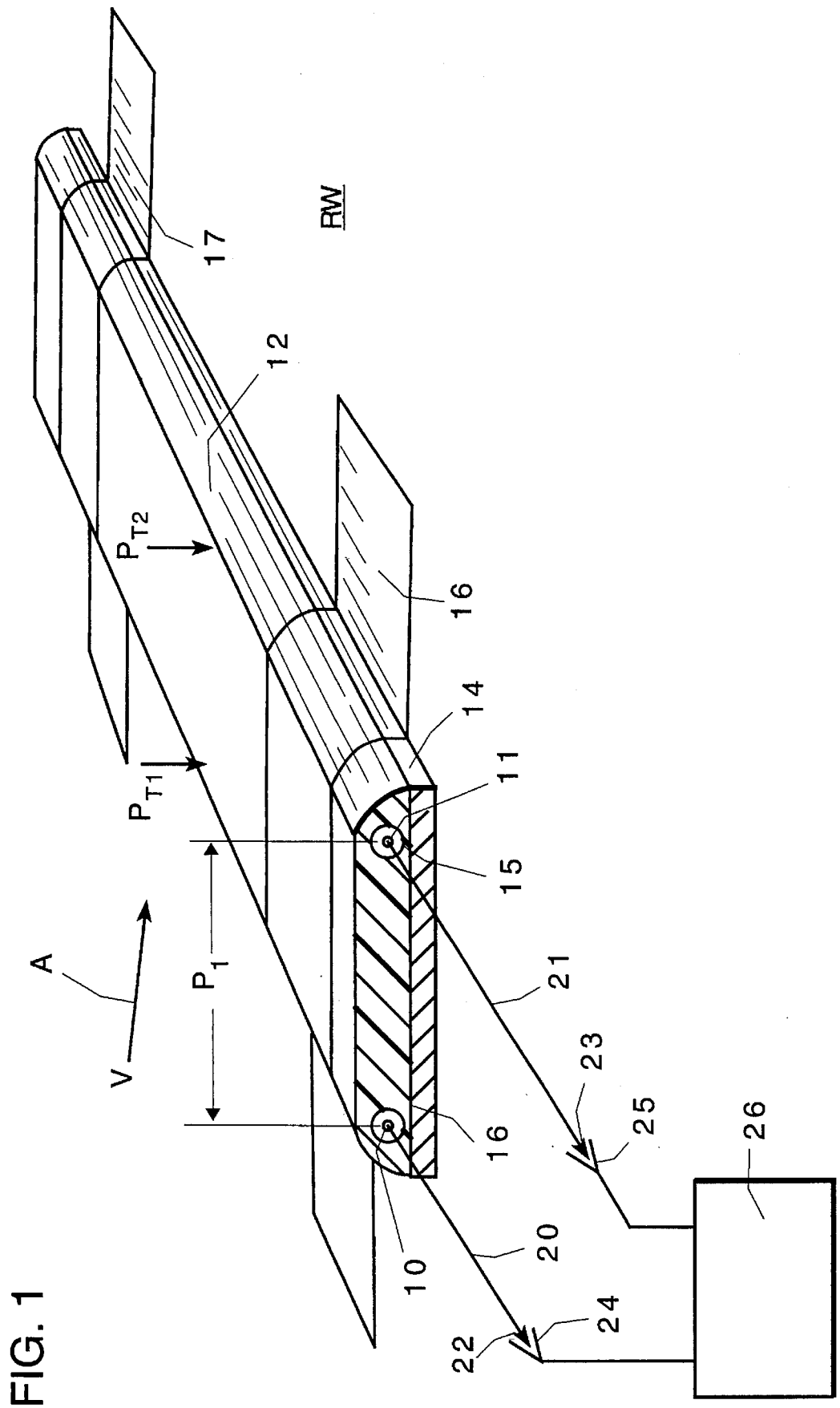
FIG. 1 is an isometric sectional view of a roadway speed detector incorporating the invention.

Referring to FIG. 1, a pair of piezoelectric sensor cables 10 and 11 are embedded in flexible carrier 12 which is a roadway grade rubber, such as neoprene. Carrier 12 maintains the spacing between sensor cables 10 and 11 a fixed distance apart. In the embodiment shown in FIG. 1, the overall width of the carrier is about 4 inches and the center-to-center spacing D between sensor cables 10 and 11 is slightly less. Carrier member 12 can be of the type shown in Tyburski application Ser. No. 07/880,410.

In this embodiment, a uniformly distributed linear weight 14 is secured by an adhesive 15 to the lower surface 16 of carrier 12. Linear weight 14 and carrier 10 has a weight per unit length sufficient to maintain the device on the surface of the roadway and as disclosed in the above-identified Tyburski applications, which are incorporated herein by reference. The weight per unit length for high speed roadways is at least about one pound per foot. For lower speed highways, the weight can be less. Lead metal has been found to be particularly useful because it molds itself to roadway undulations so the flexible carrier hugs the roadway, and, at the same time, assists in maintaining an accurate spacing D between piezoelectric sensors 10 and 11. Thus, while the sensor is flexible and coilable, it is very rigid in a plane parallel to the roadway.

If desired, roadway adhesive tape strips 16 and 17 can be used to secure the ends of the assembly to a roadway RW.

The piezoelectric sensors 10 and 11 are of the coaxial cable type manufactured by ATOCHEM Corporation of Norristown, Pa. and include a piezoelectric plastic, such as Kynar™ and a pair of sensor electrodes, one being a core electrode surrounded by the Kynar™ piezoelectric plastic, a second electrode braided and surrounding the piezoelectric plastic, an insulating layer, an braided electrostatic shield conductor and a non-conductive cover. The core electrode and second electrode of piezoelectric sensors 10 and 11 are connected to coaxial cables 20 and 21, respectively, which have electrical connectors 22 and 23 on their respective ends. Electrical connectors 22 and 23 in turn are connected to complementary connectors 24 and 25 on monitoring and speed measuring circuit 26.

Figure 2:
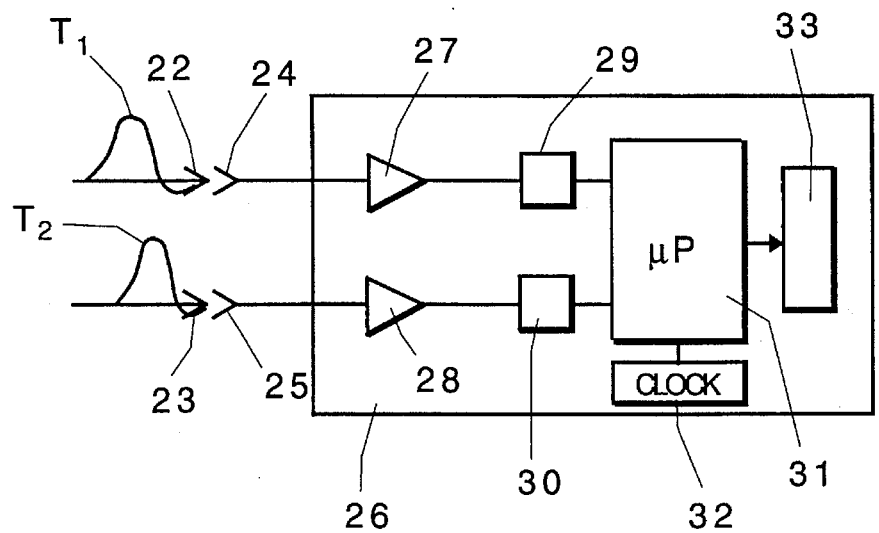
FIG. 2 is a block diagram of the circuit for determining the time interval between when the vehicle tire pressure induces a peak voltage in the closely and accurately spaced piezoelectric elements of FIG. 1.

In FIG. 1, a vehicle V is traveling on the roadway in the direction of arrow A so that the pressure PT1, of its wheels will induce a voltage in sensor 10 first and as the wheels traverse the surface of carrier 12, the pressure on sensor 11 will peak at PT2 and induce voltages T1 and T2 (FIG. 2).

Speed measuring circuit 26, as shown in FIG. 2, includes buffer amplifier 27 connected to receive the electrical pulse signal T1 from piezoelectric sensor 10 and buffer amplifier 28 connected to receive the electrical pulse signal T2 from piezoelectric sensor 11. The pulse signal outputs T1 and T2 of buffer amplifier 27 and 28 are passed through D/A converter 29 and 30 to microprocessor 31. Microprocessor 31 is provided with clock 32 and accurately measures the difference in peak times of the two electrical pulses T1 and T2. Since the distance D between sensors 10 and 11 is very small, the times between pulses will be small. For example, a vehicle traveling at 75 miles per hour will be traveling at the speed of 0.00132 inches per microsecond. When the sensors 10 and 11 are spaced 3 inches apart, the time measurement T2-T1 would be about 2,272.72 microseconds. At 50 miles per hour, the time measurement T2-T1 would be about 3,409.09 microseconds.

It will be appreciated that the clock rate of clock 32 and microprocessor 31 can be adapted to refine and enhance the accuracy of speed measurement. Microprocessor 31 in the monitoring circuit 26 can also be adapted to count vehicles, and perform classification functions, etc.

Figure 4A:
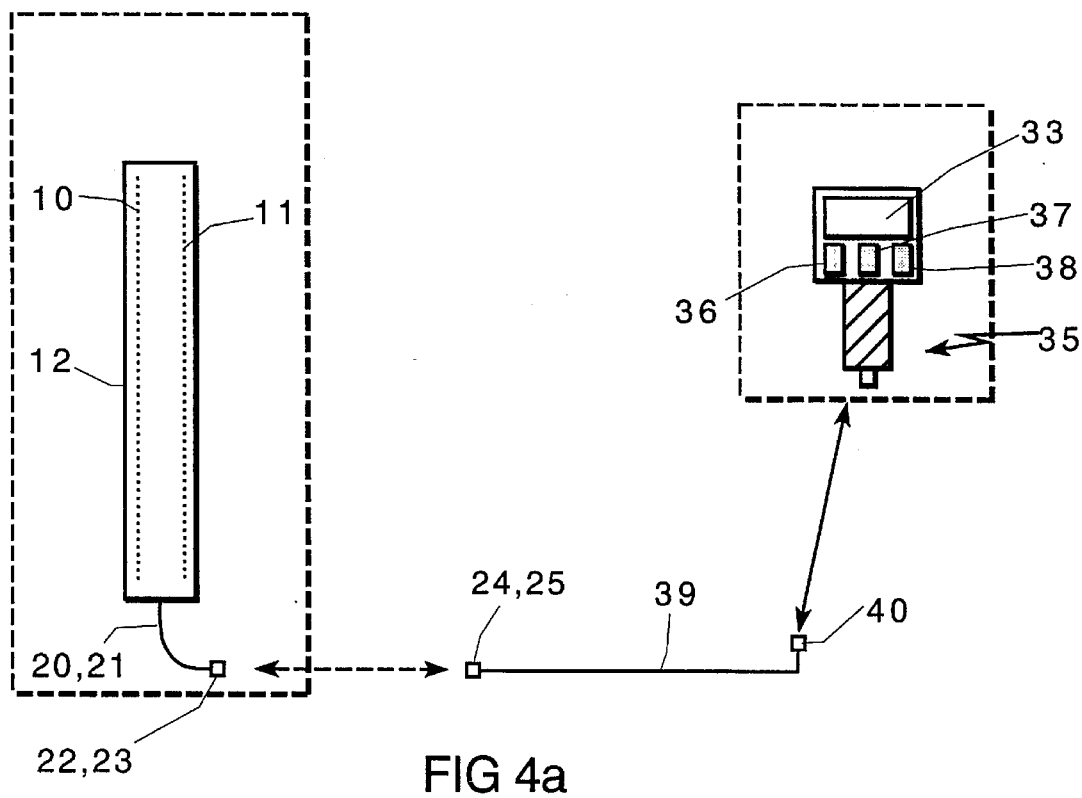
FIG. 4a is a schematic diagram of the components installed.

Microprocessor circuit 31 outputs a speed measurement signal to display 33, which, in this embodiment, is an LCD display and driver. As shown in FIG. 4a, the monitoring and speed measuring circuit 30 and the display 33 can be incorporated in a portable or hand-held unit 35. Hand-held unit 35 has an on-off switch 36, a freeze switch 37 which enables microprocessor 31 to store and continuously display the speed of the last or a selected vehicle and a resume switch 38 which enables the unit to resume active vehicle speed measurements.

Figure 4B:
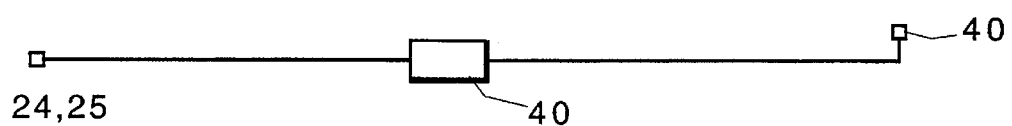
FIG. 4b is a schematic diagram of a further embodiment.
Figure 4C:
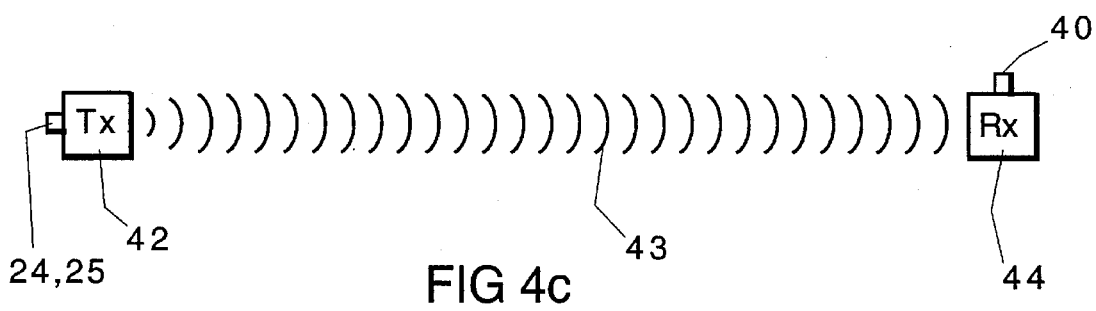
FIG. 4c is a schematic diagram of a further embodiment of the invention.

As diagrammatically shown in FIG. 4, the sensor signals on coaxial cables 20, 21 and connectors 22, 23 are connected by coaxial cables 39 to a further connector means 40 for connection to the hand-held speed monitoring unit 35. This is limited to a distance of about 200 feet. As shown in FIG. 4b, for longer distances, a self-contained two channel signal amplifier 40 can be used. As shown in FIG. 4c, the sensor signals can be supplied to an RF transmitter 42 and broadcast on an RF carrier signal 43 to a receiver 44 which is a part of or connected to hand-held unit 35 by connector 40.

Figure 3:
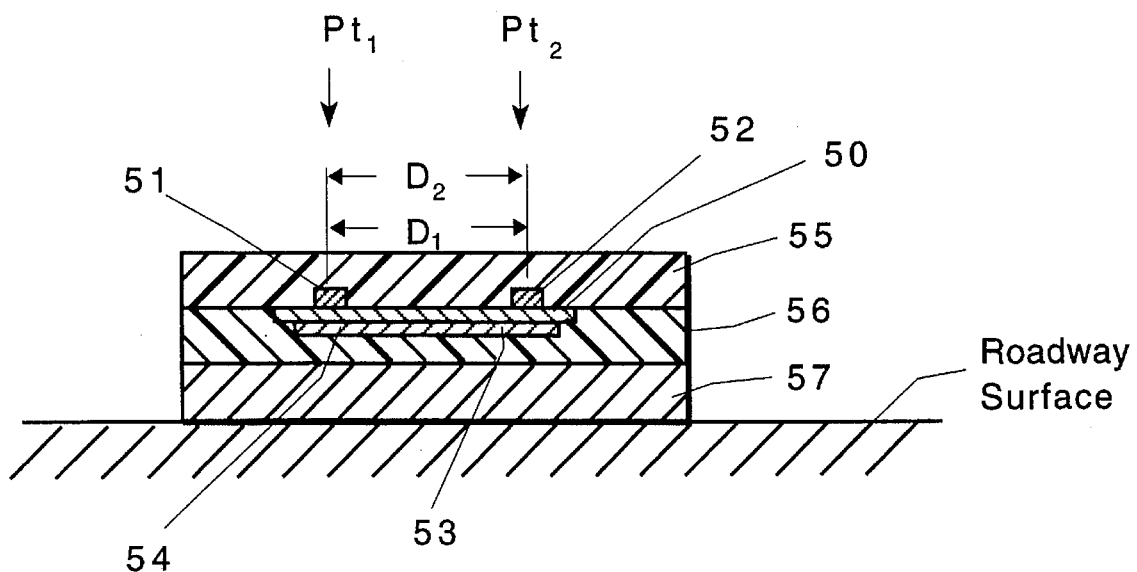
FIG. 3 is a sectional view of a modification of the piezoelectric element.

In the embodiment shown in FIG. 3, the sensor is comprised of a very thin strip of piezoelectric plastic strip 50 (Kynar™, which is available from ATOCHEM Corporation) of the type disclosed in U.S. application Ser. No. 346,685 and U.S. application Ser. No. 406,345, owned by the assignee hereof. In this embodiment, the piezoelectric film strip 50 has a first electrode 51 on one side (the left side) of film strip 50, a second electrode 52 on the opposed side (the right side of FIG. 3) and a common electrode 53 on the bottom side 54 of the film strip. The center-to-center electrode distance D2 is under about one (1) inch when the piezoelectric strip 50 is one (1) inch wide. Electrode 51, the portion of piezoelectric strip 50 under it and common electrode 53 constitute a first sensor corresponding to sensor 10 and electrode 52 and the portion of film strip 50 between it and common electrode 53 constitute a second sensor corresponding to piezoelectric sensor 11 of FIG. 1, and spaced a predetermined distance apart. It will be appreciated that a conformal insulating coating and a shield electrode can be provided as disclosed in the above-referenced Tyburski applications.

A pair of neoprene rubber members 55 and 56 are sealed or glued together to form a protective envelope. A flat linear weighting member in the form of a lead strip 57 is glued to the under side of member 56. Alternatively, the weight can be encased in the rubber of rubber member 56. The weight member and the sensor have a weight per unit length sufficient to cause the unit to hug the roadway. As noted above, and as shown in the above-referenced Tyburski applications, the weight can be incorporated in the carrier 55, 56.

For permanent installations, the carrier 12 of FIG. 1 or the unit shown in FIG. 3 can be embedded in a roadway using conventional roadway embedment techniques. In such cases, the linear weight member can be omitted.

While there has been shown and described preferred embodiments of the invention, it will be appreciated that various modifications and adaptations of the invention will be readily apparent to those skilled in the art and it is intended that such modifications and adaptations be encompassed by the claims appended hereto.

What is claimed is:

1. In a vehicle speed sensor system for sensing wheeled vehicular traffic thereover, the improvement comprising, a flexible carrier member having an elongated flat elastomeric member, a pair of elongated piezoelectric pressure sensors embedded in closely spaced parallel relation in said flat, elastomeric member, said elastomeric member maintaining the distance between said piezoelectric pressure sensors constant, and means for measuring the time interval between peak voltages induced in said piezoelectric pressure sensors by wheeled vehicular traffic thereon, and wherein said sensors include a common strip of piezoelectric plastic and a pair of spaced electrodes are formed on said common strip to constitute said pair of piezoelectric pressure sensors.

2. The invention defined in claim 1 wherein the center-to-center spacing for said pair of spaced electrodes is less than one (1) inch.

\* \* \* \* \*

UNITED STATES PATENT AND TRADEMARK OFFICE
Certificate

Patent No. 5,554,907                          Patented: September 10, 1996

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Donald A. Dixon and Robert M. Tyburski.

Signed and Sealed this Fifteeth Day of December, 1998.

BRIAN W. BROWN
*Special Programs Examiner*
Technology Center 2800